United States Patent
Okamoto et al.

(10) Patent No.: US 6,611,056 B2
(45) Date of Patent: Aug. 26, 2003

(54) COMPOSITE MATERIAL, AND MANUFACTURING METHOD AND USES OF SAME

(75) Inventors: Kazutaka Okamoto, Hitachi (JP); Yasuo Kondo, Hitachinaka (JP); Teruyoshi Abe, Hitachi (JP); Yasuhisa Aono, Hitachi (JP); Junya Kaneda, Hitachi (JP); Ryuichi Saito, Hitachi (JP); Yoshihiko Koike, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 26 days.

(21) Appl. No.: 10/101,851

(22) Filed: Mar. 21, 2002

(65) Prior Publication Data

US 2002/0145195 A1 Oct. 10, 2002

Related U.S. Application Data

(62) Division of application No. 09/513,330, filed on Feb. 25, 2000.

(30) Foreign Application Priority Data

Mar. 16, 1999 (JP) ............................................. 11-069540

(51) Int. Cl.[7] ......................... H01L 23/10; H01L 23/34
(52) U.S. Cl. ...................................... 257/706; 257/675
(58) Field of Search ................................ 257/707, 706, 257/762, 746, 703, 702, 675

(56) References Cited

U.S. PATENT DOCUMENTS

| | | | |
|---|---|---|---|
| 5,089,356 A | | 2/1992 | Chung |
| 5,443,615 A | | 8/1995 | Kuwabara et al. |
| 5,561,321 A | * | 10/1996 | Hirano et al. |
| 5,601,932 A | * | 2/1997 | Krum et al. |
| 5,818,105 A | * | 10/1998 | Kouda |
| 5,828,127 A | * | 10/1998 | Yamagata et al. |
| 5,882,532 A | | 3/1999 | Field et al. |
| 6,056,186 A | * | 5/2000 | Dickson et al. |
| 6,114,048 A | * | 9/2000 | Jech et al. |
| 6,238,454 B1 | * | 5/2001 | Polese et al. |
| 6,245,442 B1 | * | 6/2001 | Towata et al. |
| 6,252,725 B1 | | 6/2001 | Tran et al. |

FOREIGN PATENT DOCUMENTS

| | | |
|---|---|---|
| EP | 0340957 | 11/1989 |
| EP | 0475575 | 3/1992 |
| EP | 1167559 | 1/2002 |
| JP | 8-78578 | 3/1996 |
| JP | 9-15773 | 6/1997 |
| JP | 9-181220 | 7/1997 |
| JP | 9-209058 | 8/1997 |
| WO | 9209711 | 6/1992 |

* cited by examiner

Primary Examiner—Sheila V. Clark
(74) Attorney, Agent, or Firm—Antonelli, Terry, Stout & Kraus, LLP

(57) ABSTRACT

Provided are a composite material excellent in plastic workability, a method of producing the composite material, a heat-radiating board of a semiconductor equipment, and a semiconductor equipment to which this heat-radiating board is applied. This composite material comprises a metal and an inorganic compound formed to have a dendritic shape or a bar shape. In particular, this composite material is a copper composite material, which comprises 10 to 55 vol. % cuprous oxide ($Cu_2O$) and the balance of copper (Cu) and incidental impurities and has a coefficient of thermal expansion in a temperature range from a room temperature to 300° C. of from $5 \times 10^{-6}$ to $17 \times 10^{-6}$/° C. and a thermal conductivity of 100 to 380 W/m·k. This composite material can be produced by a process comprising the steps of melting, casting and working and is applied to a heat-radiating board of a semiconductor article.

7 Claims, 12 Drawing Sheets

100 μm

100 μm

100 μm

100 μm

100 μm

100 μm

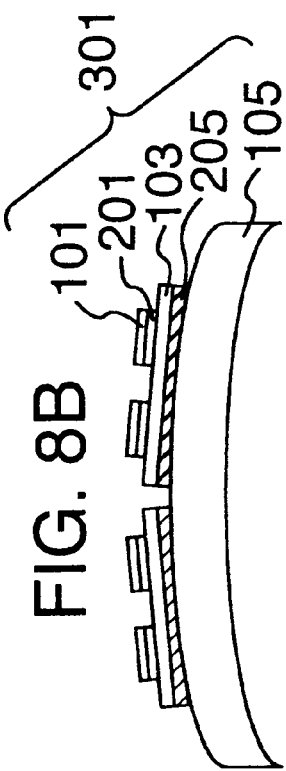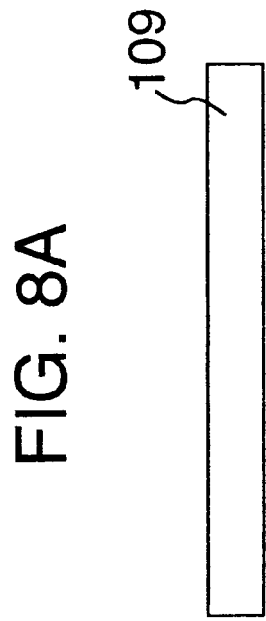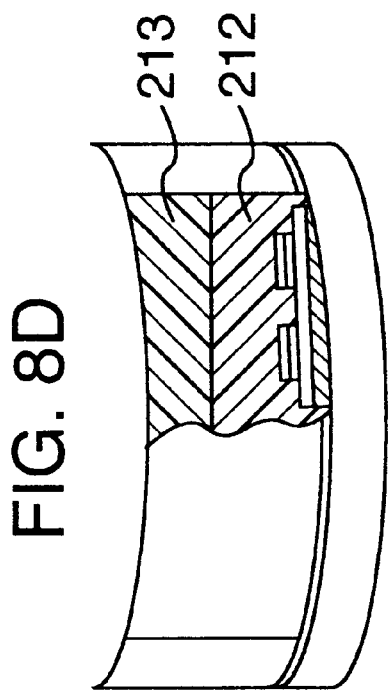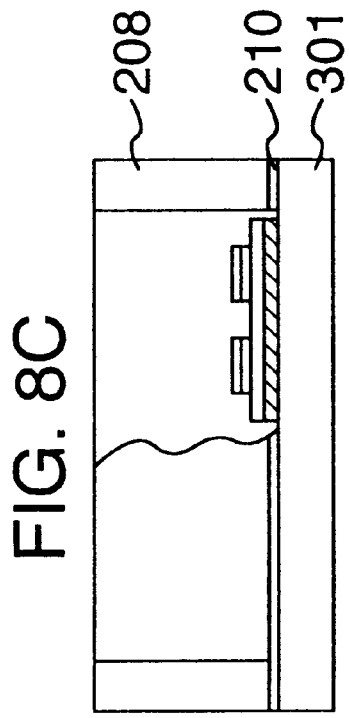

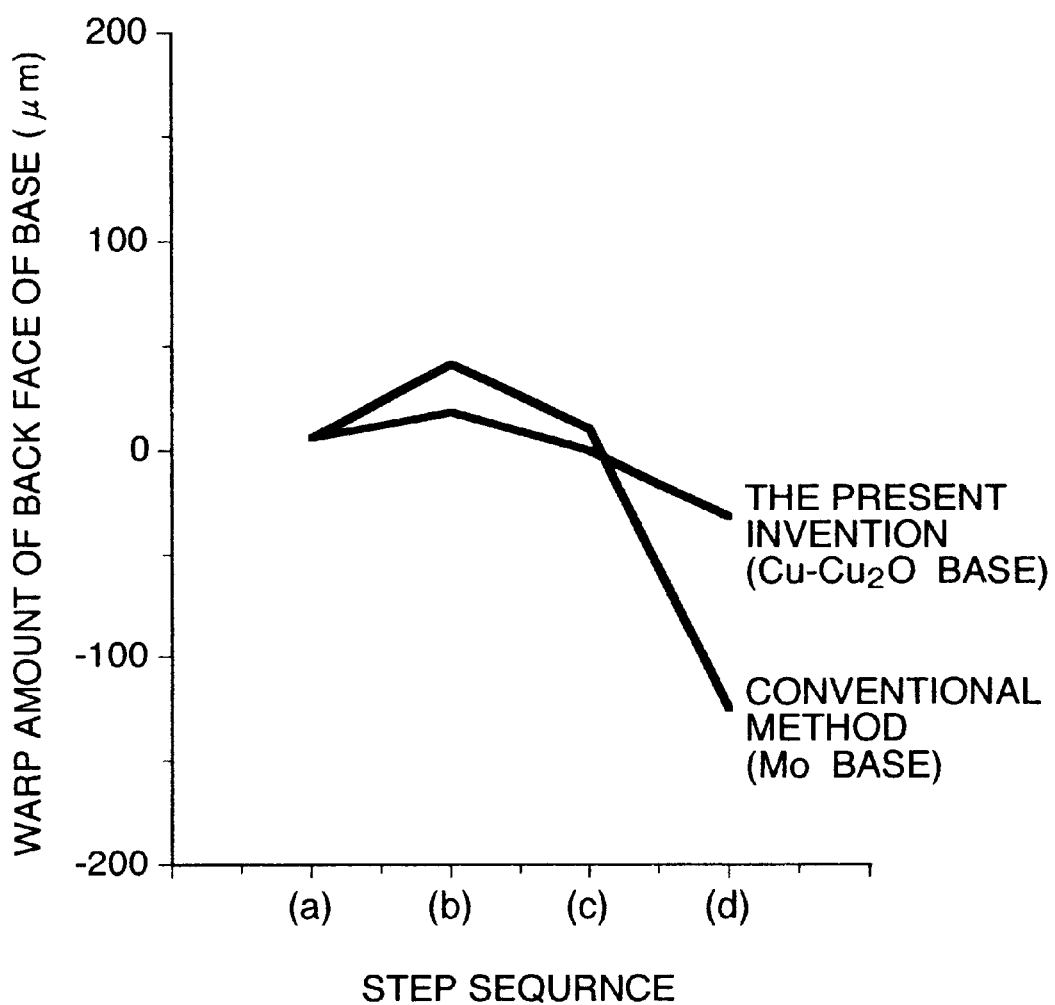

FIG. 10A
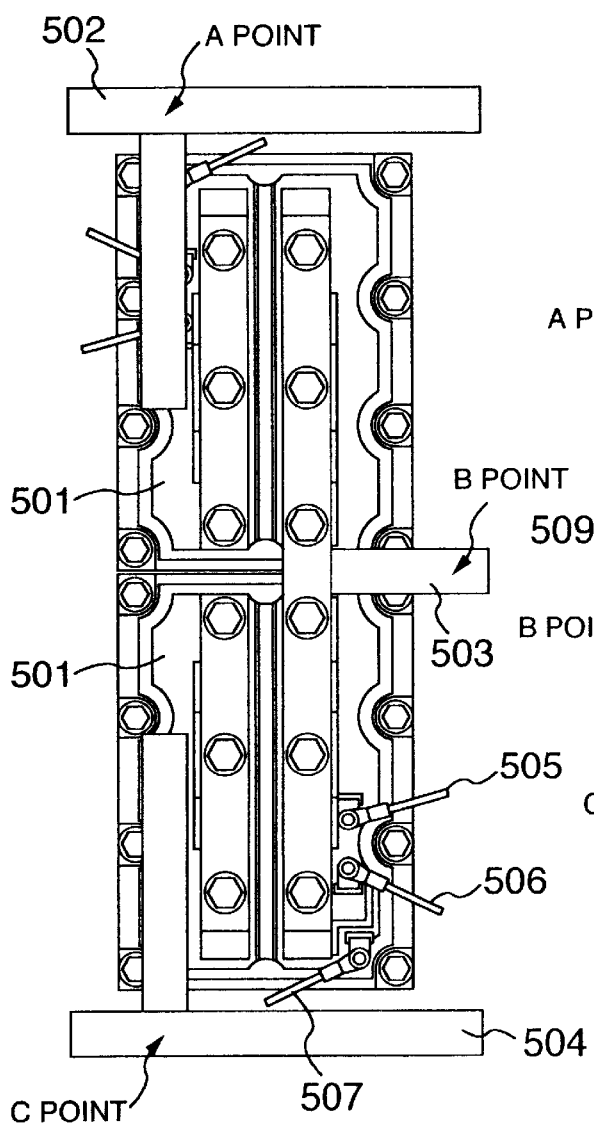
FIG. 10C
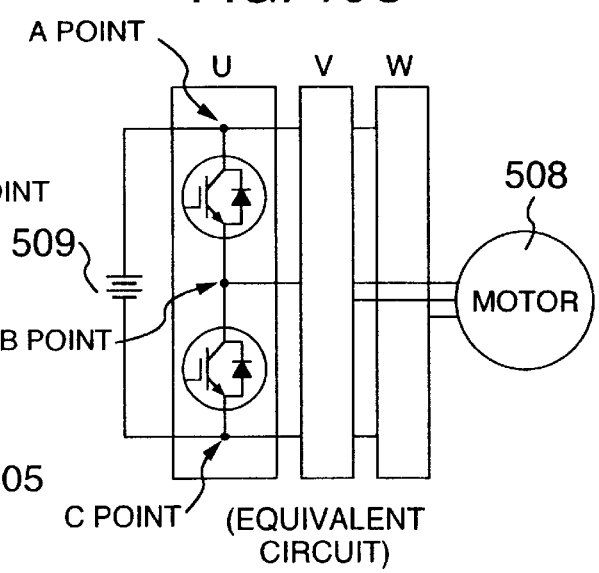
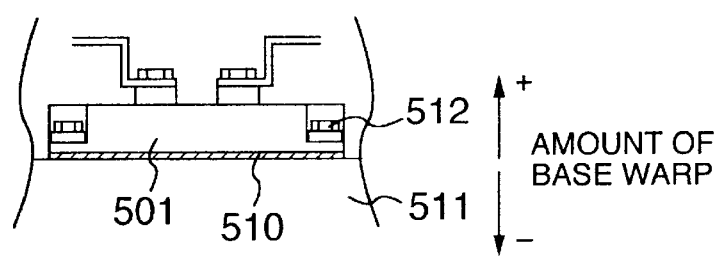
FIG. 10B

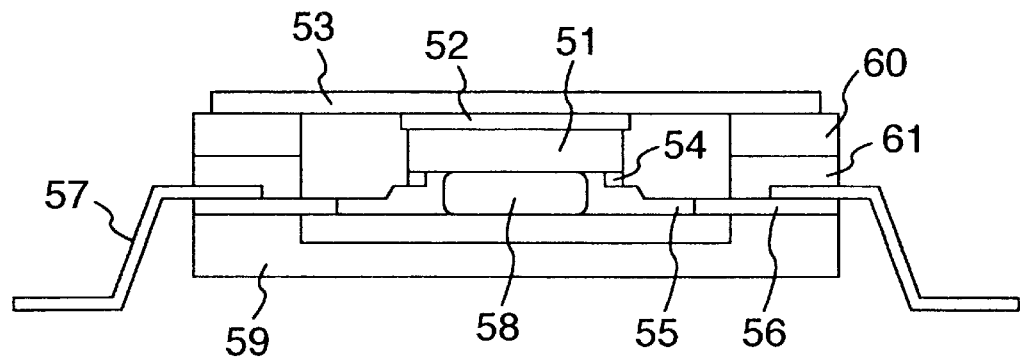
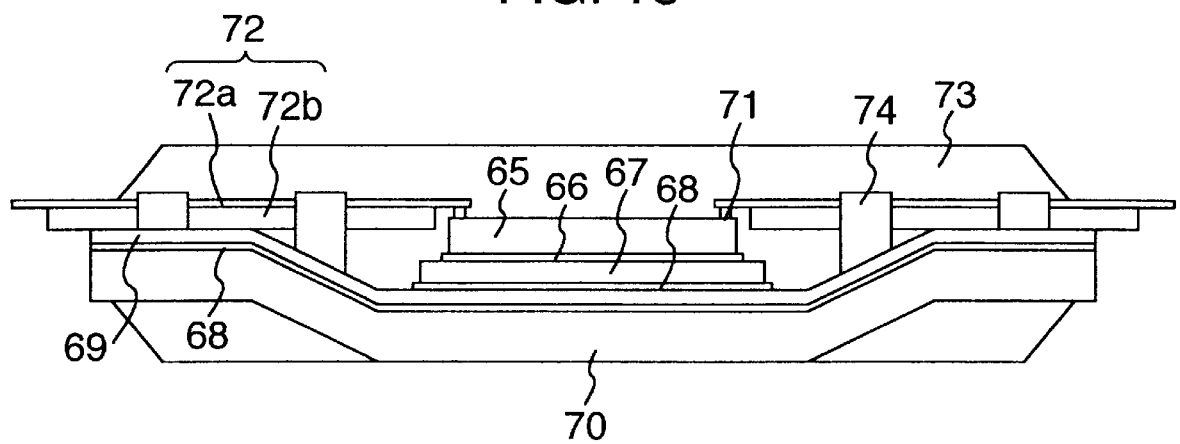

COMPOSITE MATERIAL, AND MANUFACTURING METHOD AND USES OF SAME

This application is a Divisional application of application Ser. No. 09/513,330, filed Feb. 25, 2000.

BACKGROUND OF THE INVENTION

1. Field of the Invention

The invention relates to a new composite material and, more particularly, to a copper composite material of low thermal expansion and high thermal conductivity, and various kinds of uses such as a semiconductor equipment in which this composite material is used.

2. Description of the Prior Art

Techniques related to the conversion and control of electric power and energy by means of electronic devices and, in particular, power electronic devices used in an on-off mode and power conversion systems as applied techniques of these power electronic devices are called power electronics.

Power semiconductor devices with various kinds of on-off functions are used for power conversion. As such semiconductor devices, there are put to practical use not only rectifier diodes which contain pn junctions and which have conductivity only in one direction, but also thyristors, bipolar transistors, MOS FETs (metal oxide semiconductor field effect transistors) and etc. which differ from each other in various combinations of pn junctions. Moreover, there are also developed insulated gate type bipolar transistors (IGBTs) and gate turn-off thyristors (GTOs) which have a turn-off function by gate signals.

These power semiconductor devices causes the generation of heat by energization and the amount of generated heat tends to increase because of the high capacity design and high speed design of power semiconductor devices. In order to prevent the deterioration of the properties of a semiconductor device and the shortening of its service life from being caused by the heat generation, it is necessary to provide a heat-radiating portion to thereby suppress a temperature rise in and near the semiconductor device. Because copper has a high thermal conductivity of 393 W/m·k and is inexpensive, this metal is generally used as heat-radiating members. However, because a heat-radiating member of a semiconductor equipment provided with a power semiconductor device is bonded to Si having a thermal expansion coefficient of $4.2 \times 10^{-6}/°$ C., a heat-radiating member having a thermal expansion coefficient close to this value is desired. Because the thermal expansion coefficient of copper is as large as $17 \times 10^{-6}/°$ C., the solderability of copper to the semiconductor device is not good. Therefore, materials with a coefficient of thermal expansion close to that of Si, such as Mo and W, are used as a heat-radiating member or installed between the semiconductor device and the heat-radiating member.

On the other hand, integrated circuits (ICs) formed by integrating electronic circuits on one semiconductor chip are sorted according to their functions into a memory, logic, microprocessor, etc. They are called electronic semiconductor devices in contrast with power semiconductor devices. The integration degree and operating speed of these semiconductor devices have been increasing year by year, and the amount of generated heat has also been increasing accordingly. On the other hand, an electronic semiconductor device is generally housed in a package in order to prevent troubles and deterioration by shutting it off from the surrounding atmosphere. Most of such packages are either a ceramic package or a plastic package, in which ceramic package a semiconductor device is die-bonded to a ceramic substrate and sealed, and in which plastic package a semiconductor device is encapsulated with resins. In order to meet requirements for higher reliability and higher speeds, a multi-chip module (MCM) in which multiple semiconductor devices are mounted on one substrate is also manufactured.

In a plastic package, a lead frame and terminals of a semiconductor device are connected by means of a bonding wire and encapsulated with plastics. In recent years, with an increase in the amount of generated heat of semiconductor devices, a package in which the lead frame has a heat-dissipating property and another package in which a heat-radiating board for heat dissipation is mounted have also come to be thought of. Although copper-base lead frames and heat-radiating boards of large thermal conductivity are frequently used for heat dissipation, there is such a fear as problems may occur due to a difference in thermal expansion from Si.

On the other hand, in a ceramic package, a semiconductor device is mounted on a ceramic substrate on which wiring portions are printed, and the semiconductor device is sealed with a metal or ceramic cap. Moreover, a composite material of Cu—Mo or Cu—W or a kovar alloy is bonded to the ceramic substrate and used as a heat-radiating board, and in each of these materials there is required an improvement in workability and a low cost as well as lower thermal expansion design and higher thermal conductivity design.

In an MCM (multi-chip module), multiple semiconductor devices are mounted as bare chips on the thin-film wiring formed on an Si or a metal or a ceramic substrate, are housed in a ceramic package, and are encapsulated with a lid. When the heat-radiating property is required, a heat-radiating board and a heat-radiating fin are installed in the package. Copper and aluminum are used as the material for metal substrates. Although copper and aluminum have the advantage of a high thermal conductivity, these metals have a large coefficient of thermal expansion and have inferior compatibility with semiconductor devices. For this reason, Si and aluminum nitride (AlN) are used as the substrate of a high-reliability MCM. Further, because the heat-radiating board is bonded to the ceramic package, a material having good compatibility with the package material in terms of coefficient of thermal expansion and having a large thermal conductivity is desired.

As mentioned above, all semiconductor equipments each provided with a semiconductor device generate heat during operation, and the function of the semiconductor device may be impaired if the heat is accumulated. For this reason, a heat-radiating board with excellent thermal conductivity for dissipating the heat to the outside is necessary. Because a heat-radiating board is bonded directly or via an insulating layer to the semiconductor device, its compatibility with the semiconductor device is required not only in thermal conductivity, but also in thermal expansion.

The materials for semiconductor devices presently in use are mainly Si (silicon) and GaAs (gallium arsenide). The coefficients of thermal expansion of these two materials are $2.6 \times 10^{-6}/°$ C. to $3.6 \times 10^{-6}/°$ C. and $5.7 \times 10^{-6}/°$ C. to $6.9 \times 10^{-6}/°$ C., respectively. As the materials for heat-radiating boards having a coefficient of thermal expansion close to these values, AlN, SiC, Mo, W, Cu—W, etc., have been known. However, because each of them is a single material, it is difficult to control to an arbitrary level the coefficients of heat transfer and thermal conductivity and, at the same time, there is a problem that they are poor in workability and require a high cost.

Recently, Al—SiC has been proposed as a material for heat-radiating boards. This is a composite material of Al and SiC and the coefficients of heat transfer and thermal conductivity can be controlled in a wide range by changing the proportions of the two components. However, this material has the disadvantage of very inferior workability and a high cost. A Cu—Mo sintered alloy is proposed in JP-A-8-78578, a Cu—W—Ni sintered alloy being proposed in JP-A-9-181220, a Cu—SiC sintered alloy being proposed in JP-A-9-209058, and an Al—SiC is proposed in JP-A-9-15773. In these publicly known composite materials obtained by powder-metallurgical processes, the coefficient of thermal expansion and thermal conductivity can be controlled in wide ranges by changing the ratio of the two components. However, their strength and plastic workability are low and the manufacture of sheets is difficult. In addition, there are problems of a high cost related to the production of powder, an increase in the steps of manufacturing process and etc.

SUMMARY OF THE INVENTION

The object of the invention is to provide a composite material excellent in plastic workability, a method of manufacturing the composite material, a semiconductor equipment in which the composite material is used, a heat-radiating board of the semiconductor equipment, an electrostatic adsorption device, and a dielectric board of the electrostatic adsorption device.

As a result of a repetition of various researches, the present inventors have found that the above problems can be solved by a composite material composited through the steps of melting Cu of high thermal conductivity and $Cu_2O$ of lower thermal expansion than Cu and dispersing each of these materials.

According to the first aspect of the invention, there is provided a composite material comprising a metal and an inorganic compound preferably having a smaller coefficient of thermal expansion than the metal, most of the compound being granular grains with a grain size of preferably not more than 50 $\mu$m and dendrites.

According to the second aspect of the invention, the compound comprises dendrites each having a bar-like stem and branches of a granular shape.

According to the third aspect of the invention, there is provided a composite material comprising a metal and an inorganic compound, most of the compound are granular grains with a grain size of 5 to 50 $\mu$m and dendrites, and 1 to 10% of the whole compound are fine grains with a grain size of not more than 1 $\mu$m.

According to the fourth aspect of the invention, there is provided a composite material comprising a metal and an inorganic compound, the coefficient of thermal expansion or thermal conductivity being larger in a solidification direction than in a direction vertical to the solidification direction.

Most preferably, the composite material of the invention may be one comprising copper and copper oxide.

According to the fifth aspect of the invention, there is provided a composite material comprising a metal and an inorganic compound having a shape of bar with a diameter of 5 to 30 $\mu$m, and preferably, not less than 90% of the whole of the inorganic compound in terms of the area percentage of section is in the shape of a bar with a diameter of 5 to 30 $\mu$m.

The composite material of the invention may comprise copper and copper oxide and may be plastically worked.

According to the sixth aspect of the invention, there is provided a composite material comprising copper, copper oxide and incidental impurities, the content of the copper oxide being 10 to 55% by volume, copper oxide being made to be dendrites, the coefficient of linear expansion in a temperature range from room temperature to 300° C. being $5 \times 10^{-6}/°$ C. to $17 \times 10^{-6}/°$ C., and the thermal conductivity thereof at room temperature is 100 to 380 W/m·k. This composite material has anisotropy.

According to the seventh aspect of the invention, there is provided a composite material comprising copper, copper oxide, preferably cuprous oxide ($Cu_2O$) and incidental impurities, the content of copper oxide being preferably 10 to 55% by volume, the copper oxide being provided with a shape of bars each oriented in one direction, the coefficient of linear expansion of the copper oxide in a temperature range from room temperature to 300° C. is $5 \times 10^{-6}/°$ C. to $17 \times 10^{-6}/°$ C., and the thermal conductivity thereof at room temperature is 100 to 380 W/m·k. In this composite material, the thermal conductivity in the oriented direction is higher than that in the direction at right angles to the oriented direction, and the difference between the two is preferably 5 to 100 W/m·k.

According to the eighth aspect of the invention, there are provided a manufacturing method in which a metal and an inorganic compound forming a eutectic structure with this metal are melted and solidified and, in particular, a manufacturing method of a composite material comprising copper and copper oxide. This manufacturing method preferably comprises the step of preparing a raw material of copper or copper and copper oxide, melting the raw material in an atmosphere having a partial pressure of oxygen of $10^{-2}$ Pa to $10^3$ Pa followed by casting, performing heat treatment thereof at 800° C. to 1050° C., and preferably performing cold or hot plastic working thereof.

According to the ninth aspect of the invention, there is provided a heat-radiating board for semiconductor equipment, which board is made of the above composite material. In the heat-radiating board for the semiconductor equipment may have a nickel plating layer on its surface.

According to the tenth aspect of the invention, there is provided a semiconductor equipment comprising an insulating substrate mounted on a heat-radiating board, and a semiconductor device mounted on the insulating substrate, said heat-radiating board being the same as recited in the ninth aspect of the invention.

According to the eleventh aspect of the invention, there is provided a semiconductor equipment comprising a semiconductor device mounted on a heat-radiating board, a lead frame bonded to the heat-radiating board, and a metal wire for electrically connecting the lead frame to the semiconductor device, the semiconductor device being resin-encapsulated, and the heat-radiating board being the same as recited in the ninth aspect of the invention.

According to the twelfth aspect of the invention, there is provided a semiconductor equipment which comprises a semiconductor device mounted on a heat-radiating board, a lead frame bonded to the heat-radiating board, and a metal wire for electrically connecting the lead frame to the semiconductor device, the semiconductor device being resin-encapsulated, at least the face of the heat-radiating board which face is opposed to the connection face of the semiconductor device is opened, and the heat-radiating board being the same as recited in the ninth aspect of the invention.

According to the thirteenth aspect of the invention, there is provided a semiconductor equipment comprising a semiconductor device mounted on a heat-radiating board, a ceramic multilayer substrate provided with a pin for connecting external wiring and an open space for housing the semiconductor device in the middle thereof, and a metal wire for electrically connecting the semiconductor device to a terminal of the substrate, and both of the heat-radiating board and the substrate being bonded to each other so that the semiconductor device is installed in the open space, the substrate being bonded to a lid so that the semiconductor device is isolated from an ambient atmosphere, and the heat-radiating board being the same as recited in the ninth aspect of the invention.

According to the fourteenth aspect of the invention, there is provided a semiconductor equipment comprising a semiconductor device mounted on a heat-radiating board, a ceramic multilayer substrate having a terminal for connecting external wiring and a concave portion for housing the semiconductor device in the middle of the substrate, and a metal wire for electrically connecting the semiconductor device to the terminal of the substrate, both of the heat-radiating board and the substrate being bonded to each other so that the semiconductor device is installed in the concave portion of the substrate, the substrate being bonded to a lid so that the semiconductor device is isolated from an ambient atmosphere, and the heat-radiating board is the same as recited in the ninth aspect of the invention.

According to the fifteen aspect of the invention, there is provided a semiconductor equipment comprising a semiconductor device bonded to a heat-radiating board with a heat-conducting resin, a lead frame bonded to a ceramic insulating substrate, a TAB for electrically connecting the semiconductor device to the lead frame, both of the heat-radiating board and the insulating substrate being bonded to each other so that the semiconductor device is isolated from an ambient atmosphere, and an elastic body of heat-conducting resin interposed between the semiconductor device and the insulating substrate, the heat-radiating board being the same as recited in the ninth aspect of the invention.

According to the sixteenth aspect of the invention, there is provided a semiconductor equipment comprising a semiconductor device bonded onto a first heat-radiating board by use of a metal, a second heat-radiating board to which an earthing board is bonded, the first heat-radiating board being mounted on the earthing board, and a TAB electrically connected to a terminal of the semiconductor device, the semiconductor device being encapsulated by resin, the heat-radiating board being the same as recited in the ninth aspect of the invention.

According to the seventeenth aspect of the invention, there is provided a dielectric board for electrostatic adsorption devices which board is made of the composite material recited above.

According to the eighteenth aspect of the invention, there is provided an electrostatic adsorption device in which, by applying a voltage to an electrode layer, an electrostatic attractive force is generated between a dielectric board bonded to the electrode layer and a body to thereby fix the body to the surface of the dielectric board, the dielectric board being the same as the dielectric board recited in the seventeenth aspect of the invention.

In a composite material related to the invention, Au, Ag, Cu and Al with high electrical conductivity are used as metals and, particularly, Cu is the best because of its high melting point and high strength. As an inorganic compound of the composite material, it is undesirable to use conventional compounds with hardness very different from that of a base metal, such as SiC and $Al_2O_3$, as mentioned above. It is desirable to use a compound having a granular shape, relatively low hardness and an average coefficient of linear expansion in a temperature range from room temperature to 300° C. of not more than $10 \times 10^{-6}$/° C. and, more preferably, not more than $7 \times 10^{-6}$/° C. Copper oxide, tin oxide, lead oxide and nickel oxide are available as such inorganic compounds. Particularly, copper oxide with good ductility is preferred because of its high plastic workability.

A method of manufacturing a composite material related to the invention comprises the steps of melting and casting a raw material comprising copper and copper oxide, performing heat treatment at 800° C. to 1050° C., and performing cold or hot plastic working.

Further, a method of manufacturing a composite material related to the invention comprises the steps of melting and casting a raw material comprising copper or copper and copper oxide under a partial pressure of oxygen of $10^{-2}$ Pa to 10 Pa, performing heat treatment at 800° C. to 1050° C., and performing cold or hot plastic working.

Either cuprous oxide ($Cu_2O$) or cupric oxide (CuO) may be used as the raw material. The partial pressure of oxygen during melting and casting is preferably $10^{-2}$ Pa to $10^3$ Pa and is more preferably $10^{-1}$ Pa to $10^2$ Pa. Further, by changing the mixture ratio of the raw material, partial pressure of oxygen, and cooling rate during solidification, etc., it is possible to control the ratio of the Cu phase to the $Cu_2O$ phase and the size and shape of the $Cu_2O$ phase of the composite material. The proportion of the $Cu_2O$ phase is preferably in the range of 10 to 55 vol. %. Especially when the $Cu_2O$ phase becomes more than 55 vol. %, the thermal conductivity decreases and the variation of the properties of a composite material occurs, making it inappropriate to use the composite material in a heat-radiating board of a semiconductor equipment. Regarding the shape of the $Cu_2O$ phase, the shape of a dendrite formed during solidification is preferred. This is because in the dendrite branches are intricate in a complicated manner, with the result that the expansion of the Cu phase having large thermal expansion is pinned by the $Cu_2O$ phase having small thermal expansion. The branches of the dendrite formed during solidification can be controlled, by changing the blending ratio of the raw material or partial pressure of oxygen, to have a Cu phase, to have a $Cu_2O$ phase, or to have a CuO phase. Also, it is possible to increase strength by dispersing the granular, fine $Cu_2O$ phase in the Cu phase with the aid of a eutectic reaction. The size and shape of the $Cu_2O$ phase can be controlled by performing heat treatment at 800° C. to 1050° C. after casting. Furthermore, it is also possible to transform CuO (which had been formed during solidification) into $Cu_2O$ by use of internal oxidation process in the above heat treatment. In other words, this operation is based on the fact that, when CuO coexists with Cu, the transformation of CuO into $Cu_2O$ by the following formula (1) is thermally more stable at high temperatures:

$$2Cu + CuO \rightarrow Cu + Cu_2O \tag{1}$$

A predetermined period of time is required in order that Formula (1) reaches equilibrium. For example, when the heat treatment temperature is 900° C., about 3 hours are sufficient. The size and shape of the fine $Cu_2O$ phase formed in the Cu phase by a eutectic reaction can be controlled by the heat treatment.

Regarding a method of melting, in addition to ordinary casting, a unidirectional casting process, a thin-sheet continuous casting process and etc. may be used. In the ordinary casting, dendrites are isotropically formed and, therefore, the composite material is made isotropic. In the unidirectional casting process, the Cu phase and $Cu_2O$ phase are oriented in one direction and, therefore, anisotropy can be imparted to the composite material. In the thin-sheet continuous casting process, dendrites become fine because of a high solidification rate and, therefore, dendrites are oriented in the sheet-thickness direction. For this reason, anisotropy can be imparted to the composite material of sheet and, at the same time, it is possible to reduce the manufacturing cost.

Further, in a composite material of the invention, since the Cu phase and $Cu_2O$ phase constituting the composite material are low in hardness and have sufficient ductility, cold or hot working, such as rolling and forging, is possible and is performed as required after casting or heat treatment. By working the composite material, anisotropy occurs therein and besides its strength can be increased. Particularly when cold or hot working is performed, the $Cu_2O$ phase is elongated and oriented in the working direction and anisotropy in the thermal and mechanical properties occurs in the direction at right angles to the elongated direction. At this time, the thermal conductivity in the elongated and oriented direction is higher than the thermal conductivity at right angles to the oriented direction, and this difference becomes 5 to 100 W/m·k.

BRIEF DESCRIPTION OF THE DRAWINGS

FIGS. 8A to 8D are schematic drawings showing a manufacturing process of an IGBT module related to Example 5 of the invention.

FIG. 9 is a graph showing the amount of warp of the base in each step of manufacturing process of an IGBT module related to Example 5 of the invention.

FIGS. 10A, 10B and 10C are a plan view, a sectional view and an equivalent circuit view of a power conversion device in which an IGBT module related to Example 5 of the invention is mounted, respectively.

FIG. 17 is a sectional view of a semiconductor equipment related to Example 8 of the invention.

FIG. 18 is a sectional view of a semiconductor equipment related to Example 8 of the invention.

DESCRIPTION OF THE PREFERRED EMBODIMENTS

EXAMPLE 1

TABLE 1

| No. | Composition (Vol. %) Cu | Composition (Vol. %) $Cu_2O$ | Coefficient of linear expansion ($10^{-6}$/° C.) | Thermal conductivity (W/m · k) |
|---|---|---|---|---|
| 1 | 90 | 10 | 16.0 | 342 |
| 2 | 80 | 20 | 14.5 | 298 |
| 3 | 70 | 30 | 13.1 | 253 |
| 4 | 60 | 40 | 11.0 | 221 |
| 5 | 50 | 50 | 10.1 | 175 |

Figure 1:
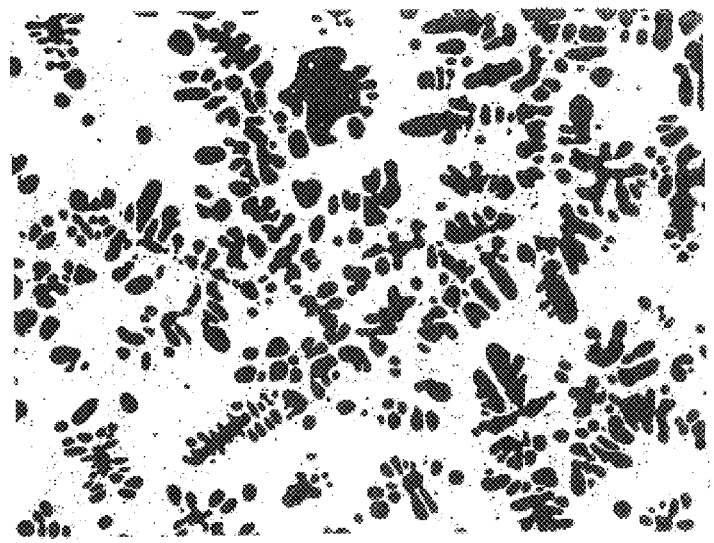
FIG. 1 is an optical micrograph showing a microstructure of a sample related to Example 1 of the invention.

Composite materials were produced by casting a raw material obtained by mixing copper and $Cu_2O$ with a purity of 2N at the ratios shown in Table 1 after melting it under atmospheric pressure. The coefficient of linear expansion, thermal conductivity and hardness of these composite materials were measured. The coefficient of linear expansion was measured in the temperature range from room temperature to 300° C. through the use of a standard sample of $SiO_2$ with the aid of a push rod type measuring device. Thermal conductivity was measured by the laser flash method. The results of these measurements are shown in Table 1. The microstructure (100×) of the obtained sample No. 3 is shown in FIG. 1. The field of view is 720×950 µm. As shown in the figure, copper oxide is formed to have dendritic shapes and besides granular grains are observed mostly with grain sizes of 10 to 50 µm with the exception of one lumpy grain with a diameter of 100 µm. Further, there are bar-like ones of not more than 30 µm in diameter and not less than 50 µm in length and dendritic ones. The number of these bars and dendrites is about 10. In addition, the matrix contains granular grains each having a grain size not more than 0.2 µm each of which is spaced about 0.5 µm from each dendrite, that is, there are non-formation zones of 0.5 µm in width between the granular one and the dendritic one. Further, there are also granular ones of not more than 0.2 µm in grain size which lie in thread-like line.

As is apparent from Table 1, the coefficients of thermal expansion and thermal conductivity vary in wide ranges by the adjustment of the proportions of Cu and $Cu_2O$, and it has become evident that the coefficient of thermal expansion and thermal conductivity can be controlled to have thermal characteristics required in a heat-radiating board.

On the other hand, as is apparent from the microstructure shown in FIG. 1, $Cu_2O$ becomes dendrites and the composite material has a fine structure in which the Cu phase and $Cu_2O$ phase are substantially uniformly dispersed. Incidentally, the white and black portions in the photograph represent the Cu phase and $Cu_2O$ phase, respectively.

The results of the hardness measurement reveal that the hardness of the Cu phase is Hv 75 to 80 and that the hardness of the $Cu_2O$ phase is Hv 210 to 230. As a result of an evaluation of machinability by lathing and drilling, it has become evident that the machinability is so excellent that it is easy to obtain any intended shape from the composite material.

EXAMPLE 2

TABLE 2

| | Composition (Vol. %) | | Coefficient of linear expansion $(10^{-6}/° C.)$ | | Thermal conductivity (W/m · k) | | Longitudinal direction |
|---|---|---|---|---|---|---|---|
| No. | Cu | $Cu_2O$ | Longitudinal direction | Transverse direction | Longitudinal direction | Transverse direction | Transverse direction |
| 7 | 80 | 20 | 14.3 | 14.7 | 320 | 275 | 1.16 |
| 8 | 60 | 40 | 11.0 | 10.9 | 231 | 208 | 1.11 |

Figure 2:
FIG. 2 is an optical micrograph showing a microstructure of a sample related to Example 2 of the invention.

Composite materials were produced by the unidirectional solidification process by casting a raw material obtained by mixing copper and $Cu_2O$ with a purity of 3N at the ratios shown in Table 2 after melting it under different partial pressures of oxygen. The microstructure (100x) of the sample No. 7, which was cast after melting in an atmosphere of an oxygen partial pressure of $10^{-2}$ Pa, is shown in FIG. 2. As is apparent from the photograph, some of the $Cu_2O$ phase become dendrites and besides granular grains are observed mostly with grain sizes of 5 to 50 μm. Further, in the structure, there are linearly lying bar-like ones and dendritic ones each of which bar-like and dendritic ones is not more than 30 μm in diameter and not less than 50 μm in length. The number of these ones is about 16. One lumpy grain with a diameter of not less than 100 μm can be seen. In the matrix, most of the $Cu_2O$ phase are granular ones not more than 0.2 μm in grain size and thread-like ones lying to form network. Regarding the fine $Cu_2O$ grains in the matrix, it is noted that there are nonformation zones similarly to the case of FIG. 1.

Figure 3:
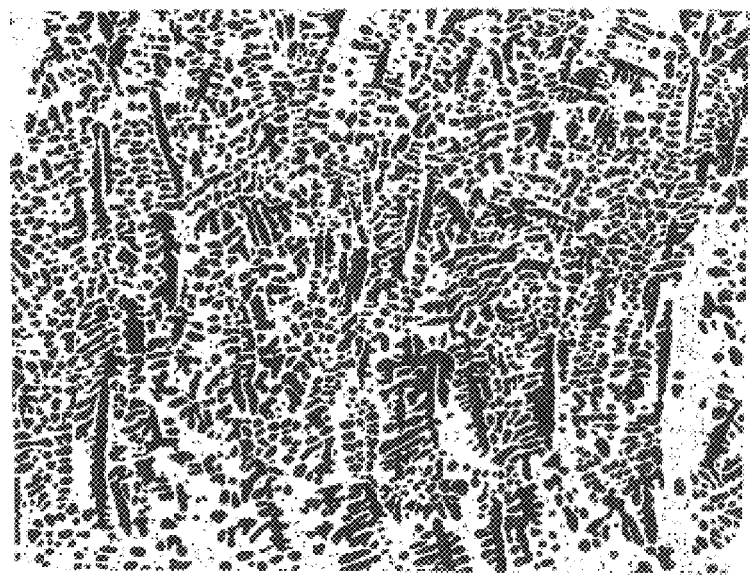
FIG. 3 is an optical micrograph showing another microstructure of a sample related to Example 2 of the invention.

The microstructure (100x) of the sample No. 8, which was obtained by casting after melting in an atmosphere of an oxygen partial pressure of $10^3$ Pa, is shown in FIG. 3. As is apparent from the photograph, the $Cu_2O$ phase forms dendrites and the structure is oriented in one direction. It has become also apparent that the shape and density of the $Cu_2O$ phase can be controlled by changing the raw material and partial pressure of oxygen. As shown in the figure, there are granular ones with a grain size of 5 to 30 μm, dendritic ones and bar-like ones of not more than 30 μm in diameter and not more than 50 μm in length. The number of these dendritic ones and bar-like ones is about 33, and the longest one has a length of about 200 μm. Similarly to the cases of the composite materials shown in FIGS. 1 and 2, the matrix contains granular grains each having a grain size not more than 0.2 μm, and there are nonformation zones between the granular grain, bar-like one, and dendritic one, and in this example these ones are formed densely all over the matrix, so that an area where the fine grains are formed becomes small.

In Table 2 are shown the measurement results of the coefficient of linear expansion and thermal conductivity of the above two kinds of composite materials. From the results, it has been observed that in each of the composite materials, anisotropy occurs regarding the coefficient of linear expansion and thermal conductivity. The longitudinal direction is the solidification direction of castings and the transverse direction is a direction vertical to the solidification direction. The coefficient of linear expansion is slightly larger in the longitudinal direction than in the transverse direction when the $Cu_2O$ content becomes not less than 30 vol. %, and thermal conductivity becomes not less than 1.1 times larger in the longitudinal direction than in the transverse direction.

Incidentally, even by blowing oxygen gas into the melt of the raw material, the same result as in the case where oxygen was used as the atmosphere gas was obtained.

EXAMPLE 3

TABLE 3

| | Composition (Vol. %) | | Working condition | Coefficient of linear expansion $(10^{-6}/° C.)$ | | Thermal conductivity (W/m · k) | |
|---|---|---|---|---|---|---|---|
| No. | Cu | $Cu_2O$ | | Longitudinal direction | Transverse direction | Longitudinal direction | Transverse direction |
| 9 | 50 | 40 | 900° C., 90% | 11.3 | 10.9 | 242 | 198 |

Figure 4:
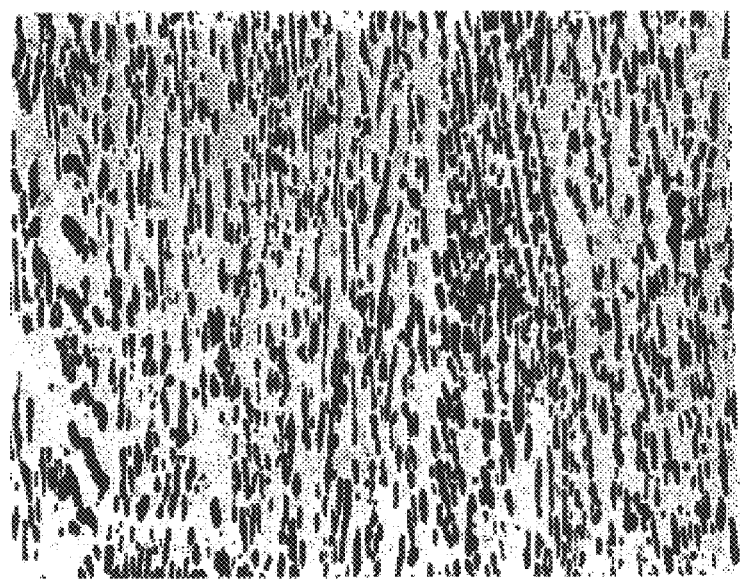
FIG. 4 is an optical micrograph showing a microstructure of a sample related to Example 3 of the invention.

The above sample No. 8 was hot worked at 900° C. up to a working ratio of 90%. As a result, it has become evident that workability is good and that the composite materials of the invention are excellent in plastic working. FIG. 4 shows the microstructure (100x) of the sample No. 9 shown in Table 3. In comparison with an as-cast composite material, there was obtained a structure in which an orientating property becomes remarkable and in which the $Cu_2O$ phase is elongated in the plastic working direction to be thereby made longer in one direction, whereby the structure of this sample comes to have an aspect ratio in the range of from 1 to 20. The diameter of bar-like one is not more than 20 μm and mostly 1 to 10 μm. The number of $CuO_2$ having a bar-like shape of not less than 100 μm in length is about 15. Fine grains of not more than 0.2 μm in an as-cast state grew to grains of about 2 to 5 μm. Further, as shown in Table 3, in the sample No. 9, more remarkable anisotropy is observed regarding the coefficient of linear expansion and thermal conductivity. In particular, the thermal conductivity in the longitudinal direction along the bar-like ones is 1.22 times larger than the thermal conductivity in the transverse direction. The coefficient of linear expansion is slightly larger in the longitudinal direction than in the transverse direction.

EXAMPLE 4

TABLE 4

| No. | Composition (Vol. %) | | Working condition | Heat treatment condition | Coefficient of linear expansion ($10^{-6}/°C$) | | Thermal conductivity (W/m · k) | |
|---|---|---|---|---|---|---|---|---|
| | Cu | Cu$_2$O | | | Longitudinal direction | Transverse direction | Longitudinal direction | Transverse direction |
| 10 | 60 | 40 | 900° C., 90% | 900° C. × 3 hrs. | 11.1 | 10.9 | 234 | 210 |

Figure 5:
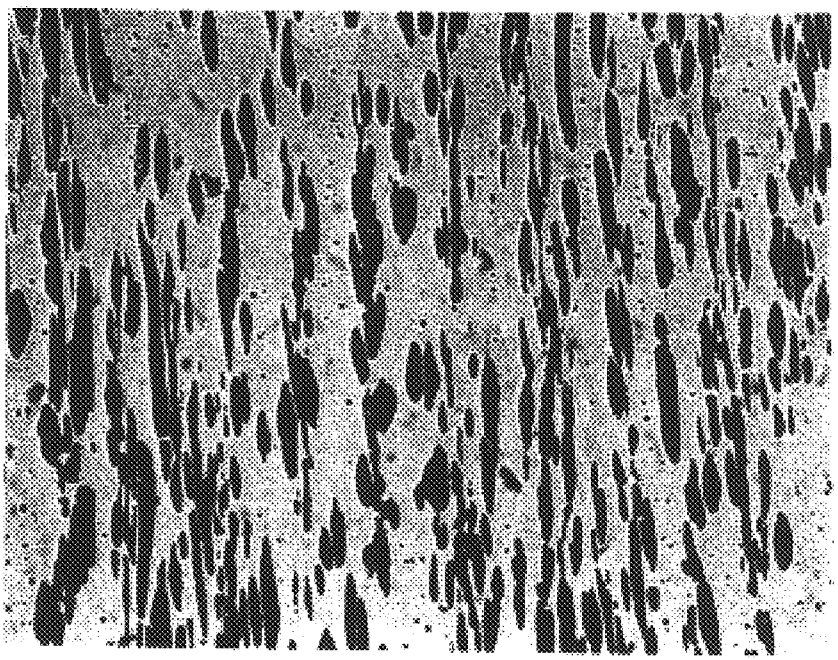
FIG. 5 is an optical micrograph showing a microstructure of a sample related to Example 4 of the invention.

FIG. 5 shows the microstructure (100×) of the sample No. 10 shown in Table 4, which was obtained by subjecting the above sample No. 9 to heat treatment at 900° C. for 3 hours. By the heat treatment, the Cu$_2$O phase was elongated in the plastic working direction, and almost all grains were coarsened to have bar diameters of 5 to 30 μm while keeping their orientating property. As a result, the number of bar-like ones of not less than 100 μm in length becomes about 50, and they lies with longer lengths than before the heat treatment. Further, fines grains grew to grains with a grain size of 2 to 5 μm, so that such fine grains disappeared. As shown in Table 4, anisotropy in the coefficient of linear expansion and thermal conductivity of this sample decreased in comparison with the sample No. 9, and thermal conductivity increased in each direction while compensating for this decrease in anisotropy. Therefore, the anisotropy in the coefficient of linear expansion and thermal conductivity was able to be controlled through the control of the structure by working or heat treatment after working. The thermal conductivity in the longitudinal direction was 1.11 times larger than the conductivity in the transverse direction.

EXAMPLE 5

In this example, a copper composite material of the invention was applied to a heat-radiating board (base board) of an insulated gate bipolar transistor module (hereinafter abbreviated as an IGBT module), which is one of power semiconductor devices.

Figure 6:
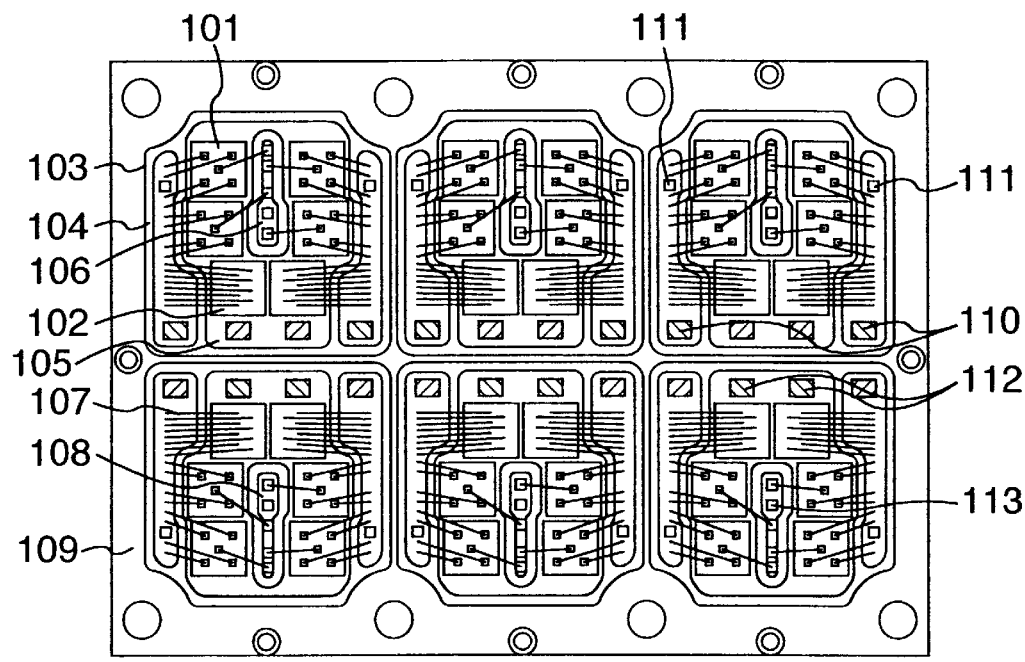
FIG. 6 is a plan view of an IGBT module related to Example 5 of the invention.
Figure 7:
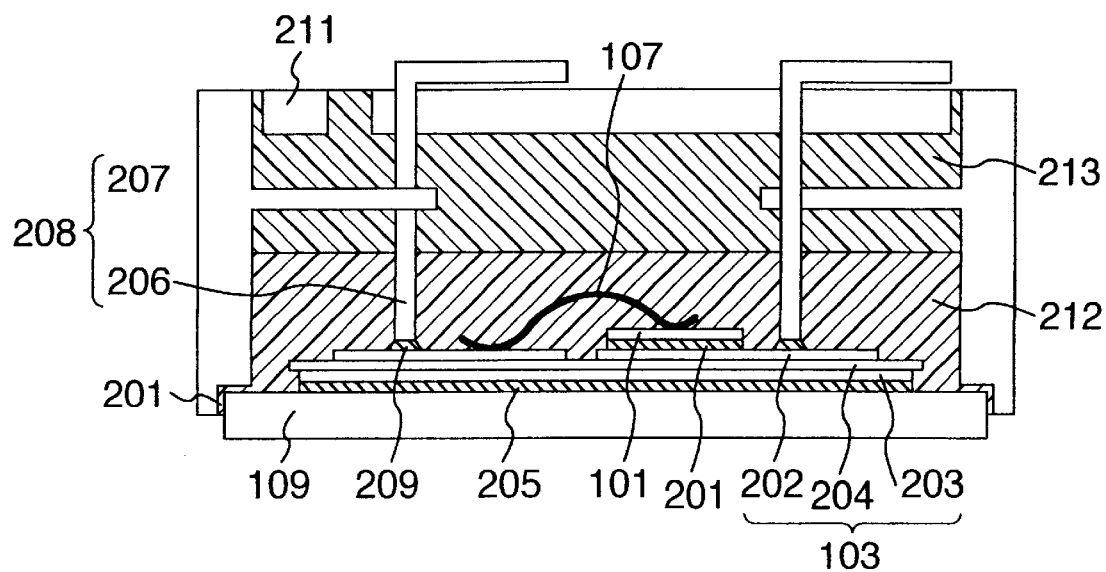
FIG. 7 is a sectional view of an IGBT module related to Example 5 of the invention.

FIG. 6 is a plan view of the interior of the module and FIG. 7 is a sectional view of a part of the module.

The IGBT elements of 1014 pieces and diode elements of 1022 pieces are bonded to an AlN substrate 103 by use of solder 201. This AlN substrate 103 is formed by bonding copper foil 202 and 203 to an AlN board 204 by use of a silver brazing material not shown in the figure. On the AlN substrate 103 are formed regions for an emitter 104, a collector 105 and a gate 106. An IGBT element 101 and a diode element 102 are soldered to the region for the collector 105. Each element is connected to the emitter 104 by means of a metal wire 107. Further, a resistor element 108 is disposed in the region for the gate 106, and a gate pad of IGBT element 101 is connected to the resistor element 108 by means of the metal wire 107. Six AlN substrates 103 on each of which a semiconductor device is mounted are bonded to a base material 109 comprising a Cu—Cu$_2$O alloy relating to the invention by use of solder 205. Between insulating substrates, interconnect is performed by solder 209 which connects a terminal 206 of a case block 208, in which the terminal 206 and a resin case 207 are integrated, to the AlN substrate 103. Further, the case 207 and the base material 109 are bonded to each other with silicone-rubber-based adhesive 210. Regarding the terminal interconnect of the case block 208, main terminals are connected on each AlN substrate 103 to two points with respect to each of emitter terminal interconnect position 110, emitter sense terminal interconnect position 111 and collector terminal interconnect position 112, and are connected to one point with respect to gate terminal interconnect position 113. Next, a silicone gel 212 is poured from a case lid 211 provided with a resin pouring port so that the whole terminal surface is coated, and a thermosetting epoxy resin 213 is then poured over the whole surface, thereby completing the module.

TABLE 5

| Material | Coefficient of linear expansion ($10^{-6}/°C$.) | Thermal conductivity (W/m · k) | Remarks |
|---|---|---|---|
| Cu-30 vol % Cu$_2$O | 13 | 253 | The invention |
| Cu | 17 | 390 | Conventional structure |
| Mo | 5 | 140 | |
| Al—SiC | 8 | 16 | |

In Table 5 are shown the coefficient of thermal expansion and thermal conductivity of usually used base materials and those of Cu and 30 vol. % Cu$_2$O, which is one of the Cu—Cu$_2$O alloy materials of the invention obtained in Examples 1 to 5. In semiconductor devices in which the base material of Cu—Cu$_2$O is used, the coefficient of thermal expansion is small in comparison with usually used modules of Cu base and, therefore, the reliability of the solder 209 which bonds the AlN substrate 103 to the base material 109 can be improved. On the other hand, in semiconductor devices of Mo base or Al—SiC base used to improve the reliability of solder under severe service conditions, the thermal conductivity is also small although the coefficient of thermal expansion is small in comparison with the semiconductor devices in which the base material of Cu—Cu$_2$O is used, with the result that the problem of large thermal resistance of a module arises. In a module in which the base of Cu—Cu$_2$O of this example is used, it is possible to ensure that reliability (life in the thermal fatigue test) is not less than 5 times larger than that of a module in which a base of Cu is used and that thermal resistance is not more than 0.8 time less than that of a module in which a base of Mo is used when the thickness of the bases is the same.

These effects enable the range of choices in the structure of a module and other members to be widened. For instance, in the example shown in FIG. 6, because a base material of Cu—$Cu_2O$ alloy has a larger thermal conductivity than a base material of Mo, in other words, because it provides improved heat-spreadability, a temperature difference between the ends and the middle of a semiconductor device during operation can be reduced to a small amount and, therefore, the size of the semiconductor device can be made about 1.2 times larger than that of a conventional module. This enables the module to be designed with 24 IGBT elements in comparison with the use of 30 IGBT elements in a conventional semiconductor device in order to ensure the same amount of current, and the module size could be made smaller. Further, it is possible to use an alumina substrate, which has a thermal conductivity about 20% smaller than AlN, as the insulating substrate. Alumina has a higher toughness than AlN, and the substrate size can be made larger. Further, the alumina substrate has a larger coefficient of thermal expansion than an AlN substrate and the difference in thermal expansion from the base material can be made smaller and, therefore, the amount of warp of the module itself can also be reduced. Because the use of an alumina substrate enables the allowable substrate size to be larger, the number of semiconductor devices capable of being loaded on one substrate can be increased. In other words, it is possible to reduce the area necessary for ensuring insulation for each insulating substrate and to reduce the area between substrates and, therefore, the module size can be smaller.

FIGS. 8A to 8D are schematic drawings of the manufacturing process of a module of this example. In FIG. 8A, the base material 109 comprising Cu—$Cu_2O$ is made to have a substantially flat surfaces coated with Ni. In FIG. 8B, the AlN substrate 103 to which the IGBT element 101 (, which is a semiconductor device,) is soldered is bonded to the base material 109 by use of solder 205. At this time, since the coefficient of thermal expansion of the base material 109 is larger than that of a composite body 301 which comprises the semiconductor device and the AlN substrate, the back face of the module is warped in concave shape during the cooling of the solder. In FIG. 8C, in the step of assembling the case block 208 with a thermosetting adhesive, since the coefficient of thermal expansion of the case is larger than that of the composite body 301 the soldering of which had been completed, the back face of the module becomes almost flat during the cooling of the adhesive. In FIG. 8D, by filling the interior of the module with the silicone gel 212 and thermosetting epoxy resin 213, the back face of the module is warped in convex shape because the thermal expansion of the resin is large.

FIG. 9 shows the result of the measurement of the amount of the warp of the back face in each step. When the Cu—$Cu_2O$ base of the invention is used, the amount of warp can be decreased to about ⅓ that of a module in which the conventional base of Mo is used. Further, in the case of a base of Cu, whose result is not shown in the figure, the difference in the coefficient of expansion from the AlN substrate is large, so that the back face of the module warps in concave shape with a large warp amount during the step of FIG. 8B, and the back face becomes concave with a warp of not less than 100 μm even after the completion of a module. In the Cu—$Cu_2O$ base of the invention the amount of warp of the module can be reduced and, therefore, it is possible to make the size of the module larger. Moreover, similarly to the amount of warp in the assembling steps, the amount of change in warp due to temperature differences during the operation of the module is also small, so that the outflow of the grease applied between the module and the cooling fin can be prevented.

FIG. 10 shows an embodiment of a power conversion device to which a module of the invention is applied. In this example, a module 501 was mounted on a heat sink 511 by means of locking bolts 512 with a heat-radiating grease 510 sandwiched between the module and the heat sink, whereby a two-level inverter was formed. In general, the modules 501 of a power semiconductor equipment are mounted in a laterally reverse relation to each other so that the midpoint (Point B) can be interconnected at one midpoint interconnect 503. The u-, v- and w-phases are connected to each of the collector-side interconnect 502 and the emitter-side interconnect 504, and power is supplied thereto from a source 509. A signal conductor is formed of a gate interconnect 505, an emitter auxiliary interconnect 506 and a collector auxiliary interconnect 507 of the module 501 of each IGBT. Numeral 508 denotes a load.

Figure 11A:
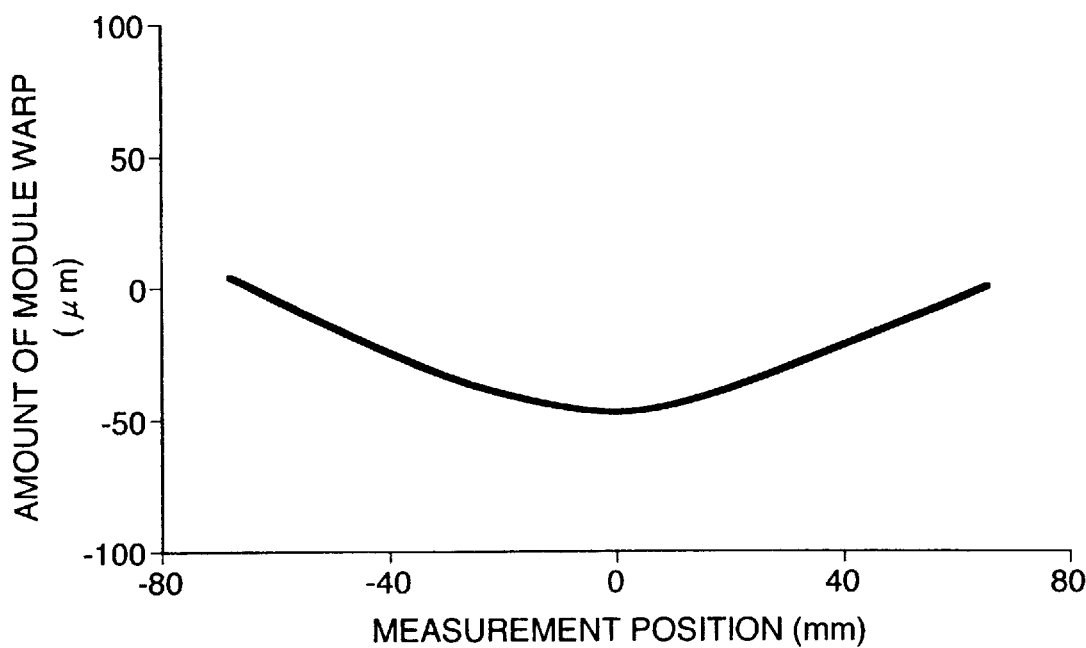
FIG. 11 is a graph showing the amount of warp before the mounting of a power conversion equipment in which an IGBT module related to Example 5 of the invention is mounted.
Figure 11B:
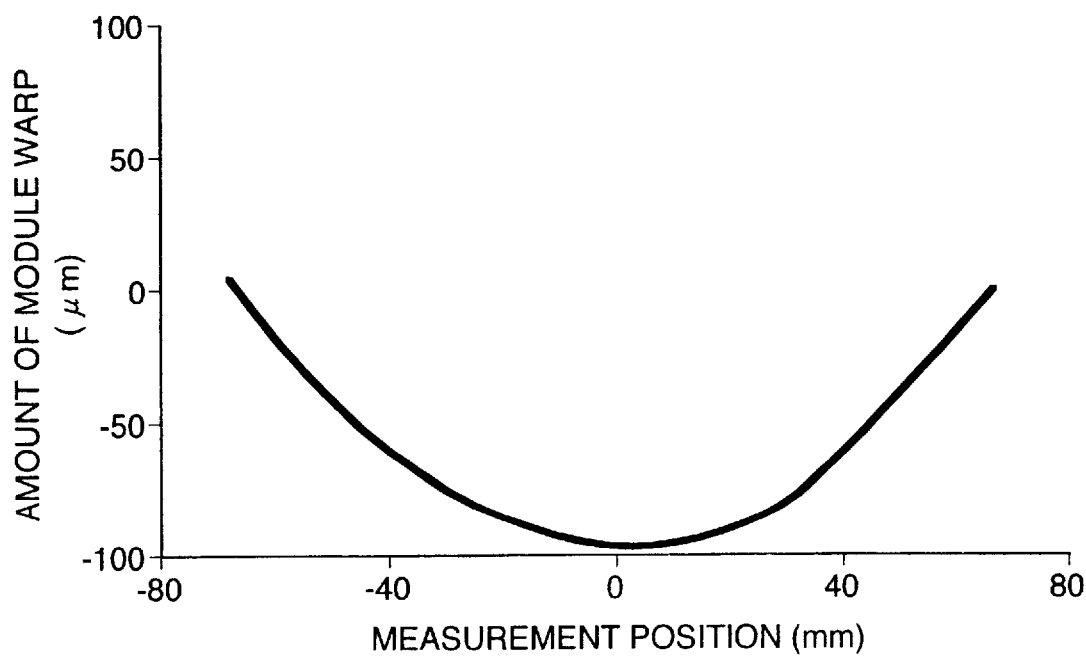
Figure 12A:
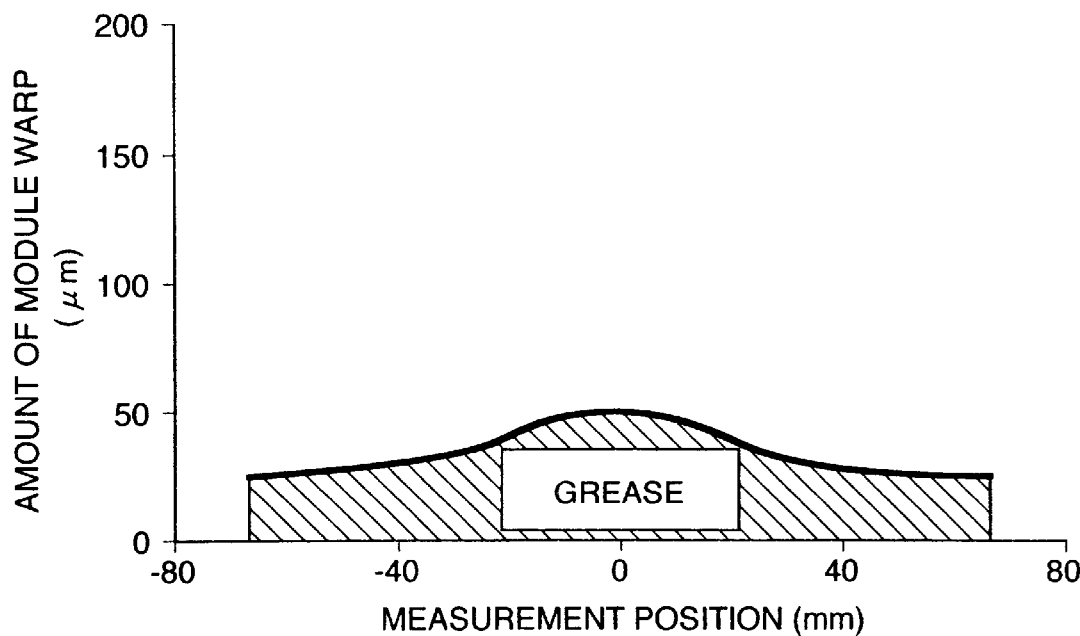
FIG. 12 is a graph showing the amount of warp after the mounting of a power conversion equipment in which an IGBT module related to Example 5 of the invention is mounted.
Figure 12B:
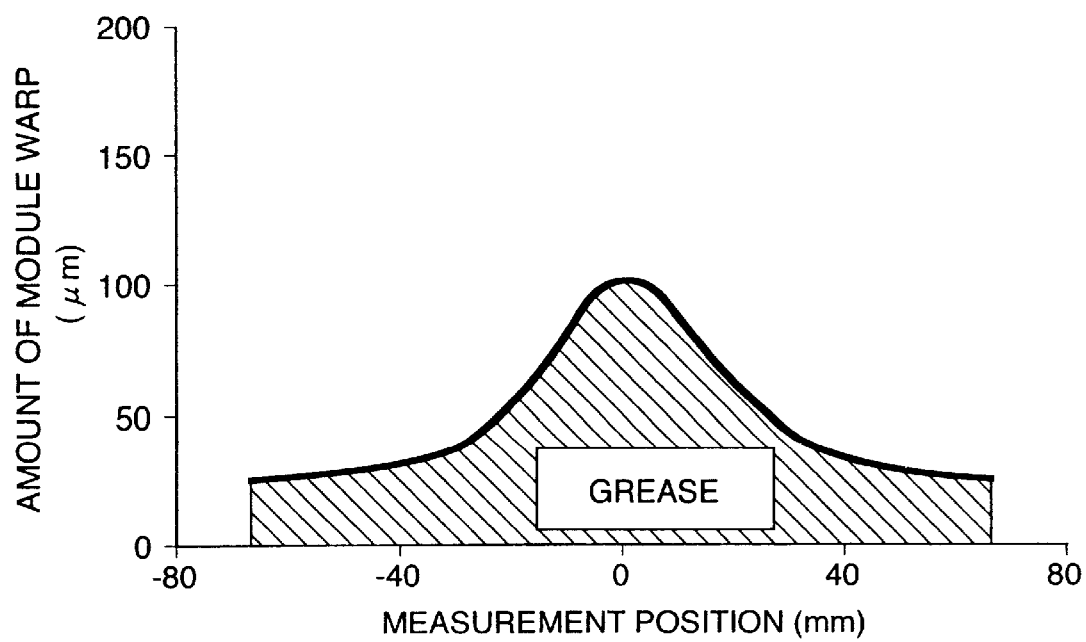

FIGS. 11A and 11B and FIGS. 12A and 12B show the amounts of warp of the back face of the module (grease thickness) measured, respectively, before and after the tightening of the module when the module was mounted. In these figures, FIGS. 11A and 12A show the module in which the Cu—$Cu_2O$ alloys of the invention shown in Examples 1 to 4 are used, and FIGS. 11A and 12B show the module of the conventional method. In the case of the conventionally known Al—SiC base module, the amount of convex warp of the back face is about 100 μm. However, when the module is tightened while applying grease, the module is deformed during tightening by being pressed by the grease, so that the back face of the module is inversely deformed in concave shape with the grease thickness larger in the middle thereof, resulting in an increase in contact resistance. In contrast to this, in the case of the Cu-30 vol. % $Cu_2O$ base of the invention, the amount of initial warp of back face is about 50 μm. However, because of large rigidity of the base material, the grease thickness in the middle of the module after grease application and tightening was suppressed to be about 50 μm, i.e., to be half the grease thickness in the conventional Al—SiC base. Further, it is also possible to reduce variations in the grease thickness within the module. The problem of deformation of a module which occurs during mounting because the module is forced by grease naturally arises even when a Cu base module of smaller rigidity than the module of Cu—$Cu_2O$ alloy base is mounted. This problem can be solved by using the module of Cu—$Cu_2O$ alloy base of the invention.

As shown in the figures, the Cu—$Cu_2$ alloy base of the invention can provide smaller thermal resistance and smaller contact thermal resistance than such base materials as Mo and Al—SiC applied to conventional high-reliability modules. As a result, the module was able to be mounted in a closely packed condition as shown in FIG. 10. Moreover, because the cooling efficiency of a cooling fin can be decreased, the mounting area and volume of a power conversion device can be reduced. Also, because grease thickness can be reduced, the allowable range of flatness of a cooling fin can be set wide and, therefore, it is possible to assemble a power conversion device by use of a large fin. Furthermore, the auxiliary cooling function such as forced cooling, etc. can be eliminated, and in this respect, small size design and low noise design can be also adopted.

EXAMPLE 6

Figure 13:
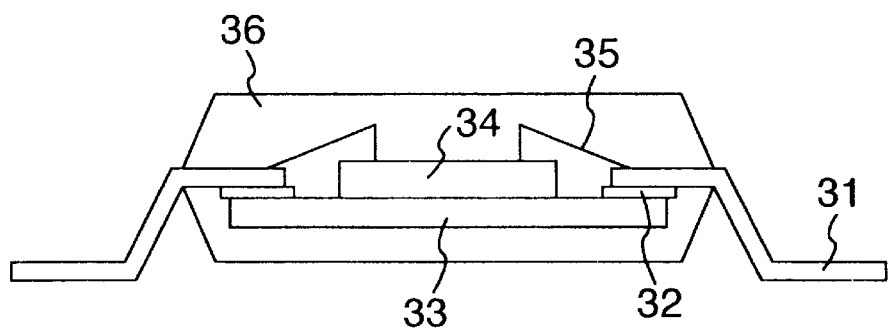
FIG. 13 is a sectional view of a plastic package with a built-in heat-radiating board related to Example 6 of the invention.
Figure 14:
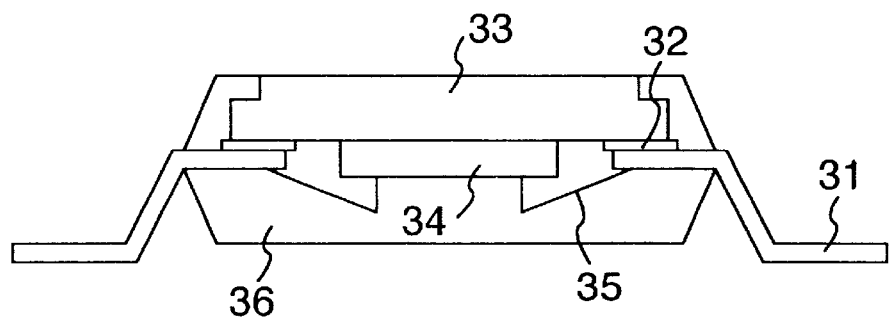
FIG. 14 is a sectional view of a plastic package with an exposed heat-radiating board related to Example 6 of the invention.

A heat-radiating board made of each of the composite materials comprising a copper—copper oxide alloy of the invention described in Examples 1 to 4 was applied to the plastic packages in each of which an IC shown in FIG. 13 and 14 was mounted. FIG. 13 shows a plastic package with a built-in heat-radiating board, and FIG. 14 shows a plastic package with an exposed heat-radiating board.

The heat-radiating boards were fabricated by changing their chemical compositions in the range of Cu-20 to 55 wt. % $Cu_2O$ so that the coefficient of thermal expansion in a temperature range from room temperature to 300° C. becomes $9\times10^{-6}/$° C. to $14\times10^{-6}/$° C., while taking the coefficient of thermal expansion of molding resin into consideration, and they were used after machining and Ni plating treatment.

In referring to FIG. 13, the structure of the package is explained below. A lead frame 31 is bonded to an Ni-plated heat-radiating board 33 made of a copper composite material of the invention via an insulating polyimide tape 32. An IC 34 is bonded to the heat-radiating board 33 by use of solder. Further, an Al electrode on the IC is connected to the lead frame by means of an Au wire 35. With the exception of a part of the lead frame, they are encapsulated with a molding resin 36 whose main components are epoxy resin, silica filler and curing agent. The package with an exposed heat-radiating board shown in FIG. 14 differs from the package shown in FIG. 13 in the respect that the heat-radiating board 33 is exposed outside the molding resin.

The packages mounted as mentioned above were observed regarding whether or not warps and cracks in the connections between the heat-radiating board and the molding resin are present. As a result, it has been found that there is no problem when the difference in thermal expansion between the molding resin and the heat-radiating board is not more than $0.5\times10^{-6}/$° C. and that in terms of chemical composition, Cu-20 to 35 wt. % $Cu_2O$ with a high thermal conductivity of 200 W/m·k is preferred.

EXAMPLE 7

Figure 15:
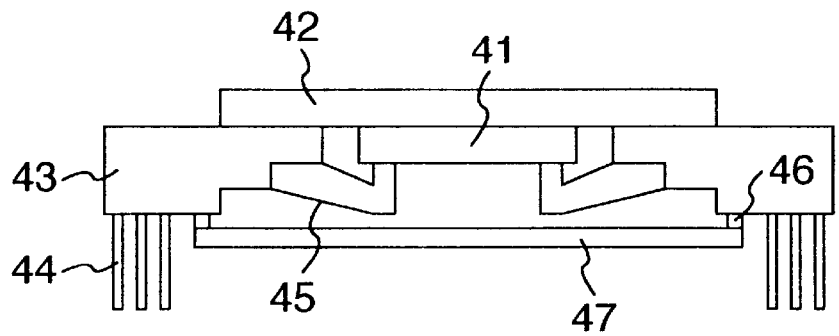
FIG. 15 is a sectional view of a ceramic package related to Example 7 of the invention.
Figure 16:
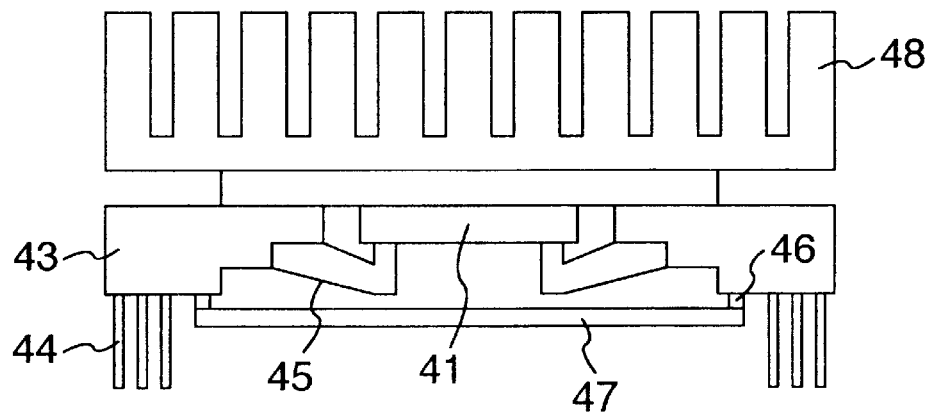
FIG. 16 is a sectional view of a ceramic package provided with a heat-radiating fin related to Example 7 of the invention.

FIGS. 15 and 16 show the cross sections of ceramic packages in which one of the copper composite materials of the invention described in Examples 1 to 4 is used as a heat-radiating board and in which an IC is mounted. First, the package shown in FIG. 15 is explained. An IC 41 is bonded to an Ni-coated heat-radiating board 42 by use of a polyimide-base resin. Further, the heat-radiating board 42 is bonded to a package 43 of $Al_2O_3$ with solder. Cu interconnect is provided in the package, which is provided with a pin 44 for the connection with an interconnect substrate. An Al electrode on the IC and the interconnect on the package are connected by means of an Al wire 45. In order to encapsulate them, a weld ring 46 of kovar was bonded to the package by use of silver solder, and the weld ring and a lid 47 of kovar were welded together by means of a roller electrode. FIG. 16 shows a package obtained by bonding a heat-radiating fin 48 to the ceramic package shown in FIG. 15.

EXAMPLE 8

FIGS. 17 and 18 show packages in which TAB (tape automated bonding) technology is applied and each of the copper composite materials of the invention described in Examples 1 to 4 is used as the heat-radiating board.

First, the package shown in FIG. 17 is explained. An IC 51 is bonded to a heat-radiating board 53 related to the invention via a heat-conducting resin 52. Au bumps 54 are formed in terminals of the IC, which are connected to TAB 55, and the TAB is in turn connected to a lead frame 57 via a thin-film interconnect 56. The IC is sealed by a ceramic substrate 59 of $Al_2O_3$, a frame 60 and a sealing glass 61 while interposing a silicone rubber 58.

FIG. 18 shows a resin-encapsulated package. An IC 65 is bonded to an Ni-plated heat-radiating board 67 related to the invention by use of an Au—Si alloy 66 and is further bonded to both of a copper grounding board 69 and an Ni-plated heat-radiating board 70 of the invention by use of a heat-conducting resin 68. On the other hand, the terminals of the IC are bonded to TAB 72 with Au bumps 71 and are encapsulated by use of a resin 73. In this package, a part of a lead frame and heat-radiating board are exposed to the outside of the encapsulating resin. The TAB is fixed to the copper grounding board by use of an epoxy-base Ag paste 74.

EXAMPLE 9

Figure 19:
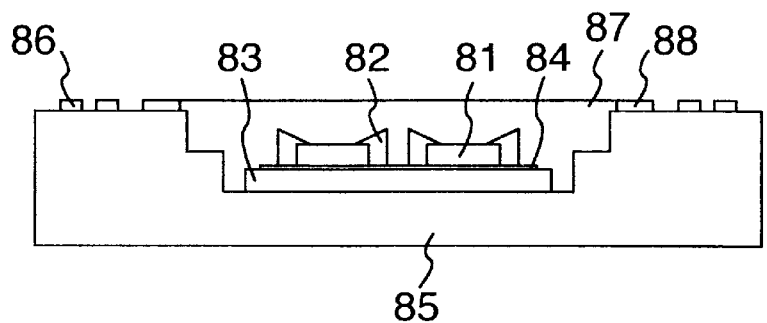
FIG. 19 is a sectional view of an MCM related to Example 9 of the invention.

FIG. 19 shows an embodiment of MCM (multi-chip model) in which each of the copper composite materials of the invention described in Examples 1 to 4 is used as the heat-radiating board. An IC 81 is connected by Au wire 82 to a thin-film interconnect 84 formed on an Ni-plated heat-radiating board 83 of the invention, the IC being further connected to an interconnect formed on a package 85 of AlN by the Au wire, and the IC is taken out as an external terminal 86. The IC portion is sealed by a lid 87 of 42-alloy while interposing and bonding a preform 88 of Au—Sn alloy between the lid 87 and the W-metallized layer of the package.

EXAMPLE 10

Figure 20:
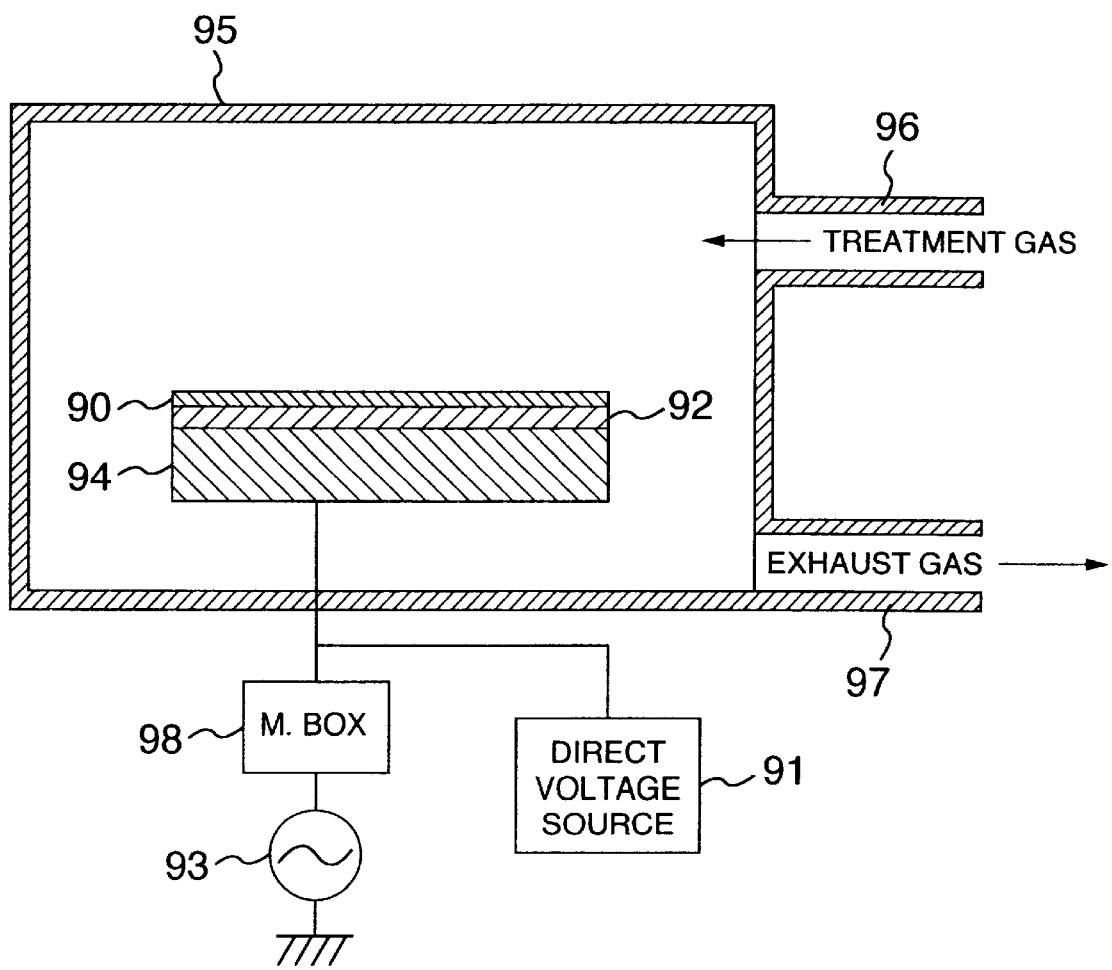
FIG. 20 is a sectional view of an electrostatic asorption device related to Example 10 of the invention.

FIG. 20 is a sectional view of an electrostatic adsorption device in which a composite material of the invention is used.

As shown in FIG. 20, this electrostatic adsorption device can be used as a chuck for a sputtering device which performs the working of a workpiece 90 of a conductor or semiconductor under a reduced pressure in a vacuum treatment chamber 95. When a voltage (about 500 V) is applied to an electrode 94 of this electrostatic adsorption device from a DC power unit 91, the workpiece 90 can be adsorbed on the surface of a dielectric board 92. The dielectric board used in this example was fabricated from each of the composite materials comprising a copper—copper oxide alloy described in Examples 1 to 4.

In performing actual sputtering, by driving an evacuation pump connected to a gas exhaust port 97 after the mounting of the workpiece 90 onto this electrostatic adsorption device, the vacuum treatment chamber 95 was evacuated until the internal pressure in the chamber became about $1\times10^{-3}$ Pa. After that, by opening a valve attached to a gas inlet 96, about 10 SCCM of reaction gas (argon gas, etc.) was introduced into the interior of the vacuum treatment chamber 95. The internal pressure in the vacuum treatment chamber 95 at this time was about $2\times10^{-2}$ Pa.

After that, by supplying high-frequency power (13.56 MHz) of about 4 kW from an electrode 94 of this electrostatic adsorption device, a plasma was generated between the electrode 94 of this electrostatic adsorption device and another electrode (not shown in the figure). In this case, the applied high-frequency voltage $V_{DC}$ and $V_{PP}$ were 2 kV and 4 kV, respectively. Incidentally, a matching box 98 disposed between the electrode 94 of this electrostatic adsorption device and a high-frequency power unit 93 was used for ensuring impedance matching with the vacuum treatment chamber 95 so that high-frequency power was efficiently supplied to a plasma.

As a result of the actual use of this sputtering device, although the temperature of the workpiece 90 reached about 450° C. during working, no cracks, etc. that might cause the occurrence of foreign matter were observed in the dielectric board 92 of this electrostatic adsorption device. This means that the use of this electrostatic adsorption device is useful for an improvement in the reliability of working.

Incidentally, it is needless to say that the same effect of an improvement in working as observed in the chuck for the sputtering device is also achieved when this electrostatic adsorption device is used as a chuck for a working apparatus for applying working to a workpiece of a conductor or semiconductor (for example, a silicon substrate) in an atmosphere under a reduced pressure (which working apparatus is so-called as a working apparatus under a reduced pressure, and include, for example, a chemical vapor-phase deposition device, physical vapor deposition device, milling device, etching device and ion implantation device).

According to this example, the heat resistance of a dielectric board of an electrostatic adsorption device can be improved without a decrease in the dielectric breakdown strength of the dielectric board. Therefore, by using an electrostatic adsorption device of the invention as a chuck for a device for performing working under a reduced pressure, the occurrence of foreign matters caused by cracks, etc. in the dielectric board can be reduced.

The composite materials of the present invention have excellent plastic workability and comprise a Cu phase with high thermal conductivity and a $Cu_2O$ phase with low thermal expansion. Because the coefficient of thermal expansion and thermal conductivity can be controlled by adjusting the contents of the Cu phase and $Cu_2O$ phase, the composite materials can be used in a wide range of applications as a heat-radiating board mounted in a semiconductor equipment, etc.

What is claimed is:

1. A semiconductor equipment comprising a heat-radiating board, an insulating substrate mounted on said heat-radiating board, and a semiconductor device mounted on said insulating substrate, said heat-radiating board being made of a composite material comprising a metal and an inorganic compound, most of said compound being granular grains with a grain size of not more than 50 µm and dendrites.

2. A semiconductor equipment comprising a heat-radiating board, a semiconductor device mounted on said heat-radiating board, a lead frame bonded to said heat-radiating board, and a metal wire for electrically connecting said lead frame to said semiconductor device, said semiconductor device being resin-encapsulated, said heat-radiating board being made of a composite material comprising a metal and an inorganic compound, most of said compound being granular grains with a grain size of not more than 50 µm and dendrites.

3. A semiconductor equipment comprising a heat-radiating board, a semiconductor device mounted on a face of said heat-radiating board, a lead frame bonded to said heat-radiating board, and a metal wire for electrically connecting said lead frame to said semiconductor device, said semiconductor device being resin-encapsulated, said heat-radiating board being provided with an open face at a side opposed to the semiconductor device-mounting face, said heat-radiating board being made of a composite material comprising a metal and an inorganic compound, most of said compound being granular grains with a grain size of not more than 50 µm and dendrites.

4. A semiconductor equipment comprising a heat-radiating board, a semiconductor device mounted on the heat-radiating board, a pin adapted to be connected to external wiring, a ceramic multilayer substrate provided at a middle thereof with an open space for housing said semiconductor device, a metal wire for electrically connecting said semiconductor device to terminals of said substrate, said heat-radiating board and said substrate being bonded to each other so that said semiconductor device is located in said open space, and a lid bonded to said substrate so that said semiconductor device is isolated from a surrounding atmosphere, said heat-radiating board being made of a composite material comprising a metal and an inorganic compound, most of said compound being granular grains with a grain size of not more than 50 µm and dendrites.

5. A semiconductor equipment comprising a heat-radiating board, a semiconductor device mounted on said heat-radiating board, a terminal adapted to be connected to external wiring, a ceramic multilayer substrate provided at a middle thereof with a concave portion for housing said semiconductor device, a metal wire for electrically connecting said semiconductor device to terminals of said substrate, said heat-radiating board and said substrate being bonded to each other so that said semiconductor device is located in said concave portion of said substrate, and a lid bonded to said substrate so that said semiconductor device is isolated from a surrounding atmosphere, said heat-radiating board being made of a composite material comprising a metal and an inorganic compound, most of said compound being granular grains with a grain size of not more than 50 µm and dendrites.

6. A semiconductor equipment comprising a heat-radiating board, a semiconductor device bonded to said heat-radiating board with a heat-conducting resin, a lead frame bonded to a ceramic insulating substrate, a TAB for electrically connecting said semiconductor device to said lead frame, said heat-radiating board and insulating substrate being bonded to each other so that said semiconductor device is isolated from a surrounding atmosphere, and an elastic body of heat-conducting resin interposed between said semiconductor device and said insulating substrate, said heat-radiating board being made of a composite material comprising a metal and an inorganic compound, most of said compound being granular grains with a grain size of not more than 50 µm and dendrites.

7. A semiconductor equipment comprising a first heat-radiating board, a semiconductor device metal-bonded to said first heat-radiating board, a second heat-radiating board to which a grounding board is bonded, said first heat-radiating board being mounted on said grounding board bonded to said second heat-radiating board, and a TAB electrically connected to terminals of said semiconductor device, said semiconductor device being resin-encapsulated, said heat-radiated board being made of a composite material comprising a metal and an inorganic compound, most of said compound being granular grains with a grain size of not more than 50 µm and dendrites.

* * * * *